United States Patent
Usuki et al.

[11] Patent Number: 6,081,144
[45] Date of Patent: Jun. 27, 2000

[54] SIGNAL CHANGE DETECTION CIRCUIT

[75] Inventors: Hideki Usuki; Akira Li, both of Kanagawa, Japan

[73] Assignee: Sony Corporation, Tokyo, Japan

[21] Appl. No.: 09/124,830

[22] Filed: Jul. 30, 1998

[30] Foreign Application Priority Data

| Jul. 31, 1997 | [JP] | Japan | ................................... | 9-206186 |
| Sep. 12, 1997 | [JP] | Japan | ................................... | 9-248450 |
| Dec. 25, 1997 | [JP] | Japan | ................................... | 9-357916 |
| Apr. 23, 1998 | [JP] | Japan | ................................... | 10-113771 |

[51] Int. Cl.[7] .............................................. H03K 3/355
[52] U.S. Cl. .......................... 327/230; 327/199; 327/291
[58] Field of Search .................................... 327/227, 230, 327/172, 175, 176, 291, 293, 294, 170, 261, 24, 185, 199, 200; 326/93, 95, 98

[56] References Cited

U.S. PATENT DOCUMENTS

| 4,583,008 | 4/1986 | Grugett | ..................................... 327/15 |
| 5,306,958 | 4/1994 | Reddy et al. | ............................. 327/14 |
| 5,306,963 | 4/1994 | Leak et al. | ................................. 327/14 |
| 5,357,204 | 10/1994 | Knoll | ......................................... 327/259 |
| 5,606,269 | 2/1997 | Pontius et al. | ............................ 326/93 |
| 5,642,068 | 6/1997 | Wojcicki et al. | ......................... 327/172 |

FOREIGN PATENT DOCUMENTS

| 0 318 929 A2 | 6/1989 | European Pat. Off. . |
| 0 482 868 A2 | 4/1992 | European Pat. Off. . |
| 0 558 079 A2 | 9/1993 | European Pat. Off. . |
| 0 574 606 A1 | 12/1993 | European Pat. Off. . |
| 0 624 878 A2 | 11/1994 | European Pat. Off. . |
| 57-127329 | 8/1982 | Japan . |
| 06325574 | 11/1994 | Japan . |
| 09069291 | 3/1997 | Japan . |

*Primary Examiner*—Timothy P. Callahan
*Assistant Examiner*—Minh Nguyen
*Attorney, Agent, or Firm*—Ronald P. Kananen; Rader, Fishman & Grauer

[57] ABSTRACT

An input signal SIN is input to a reset input terminal R of a flip-flop RSFF1 and, at the same time, input to a gate of a pMOS transistor MP1 constituting a transfer control circuit DCNTL1, a signal Bd obtained by delaying an inverted output signal B of the flip-flop RSFF1 at a delay circuit DLY1 is input to the data input terminal of the transfer control circuit DCNTL1, and the output signal of the transfer control circuit DCNTL1 is input to a set input terminal S of the flip-flop RSFF1 via two stages of inverters connected in series, therefore, a signal change detection circuit capable of generating a stable pulse according to the level change of the input signal without depending upon the input clock signal and capable of generating the pulse at high speed can be realized.

12 Claims, 15 Drawing Sheets

FIG. 2A  $S_{IN}$
FIG. 2B  B
FIG. 2C  Bd
FIG. 2D  $S_{OUT}$

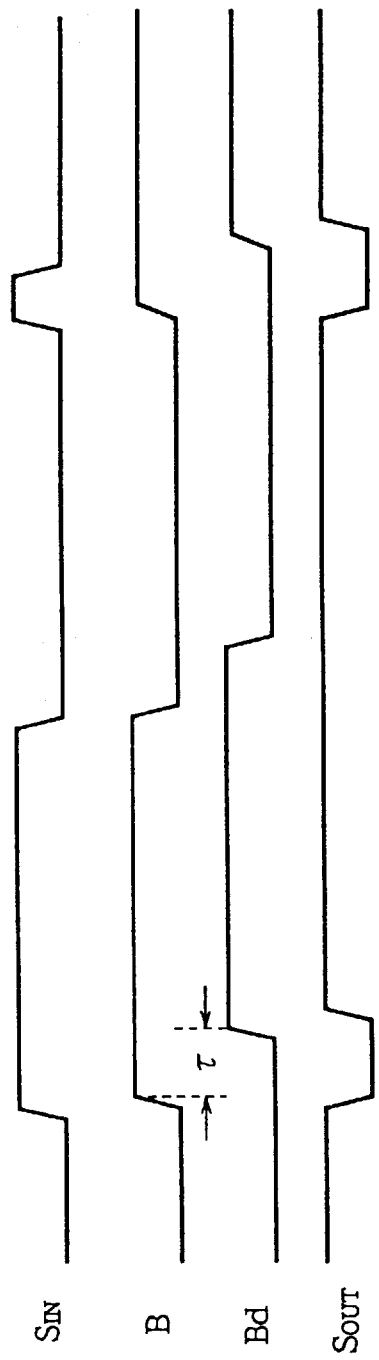
FIG. 4A  $S_{IN}$
FIG. 4B  B
FIG. 4C  Bd
FIG. 4D  $S_{OUT}$

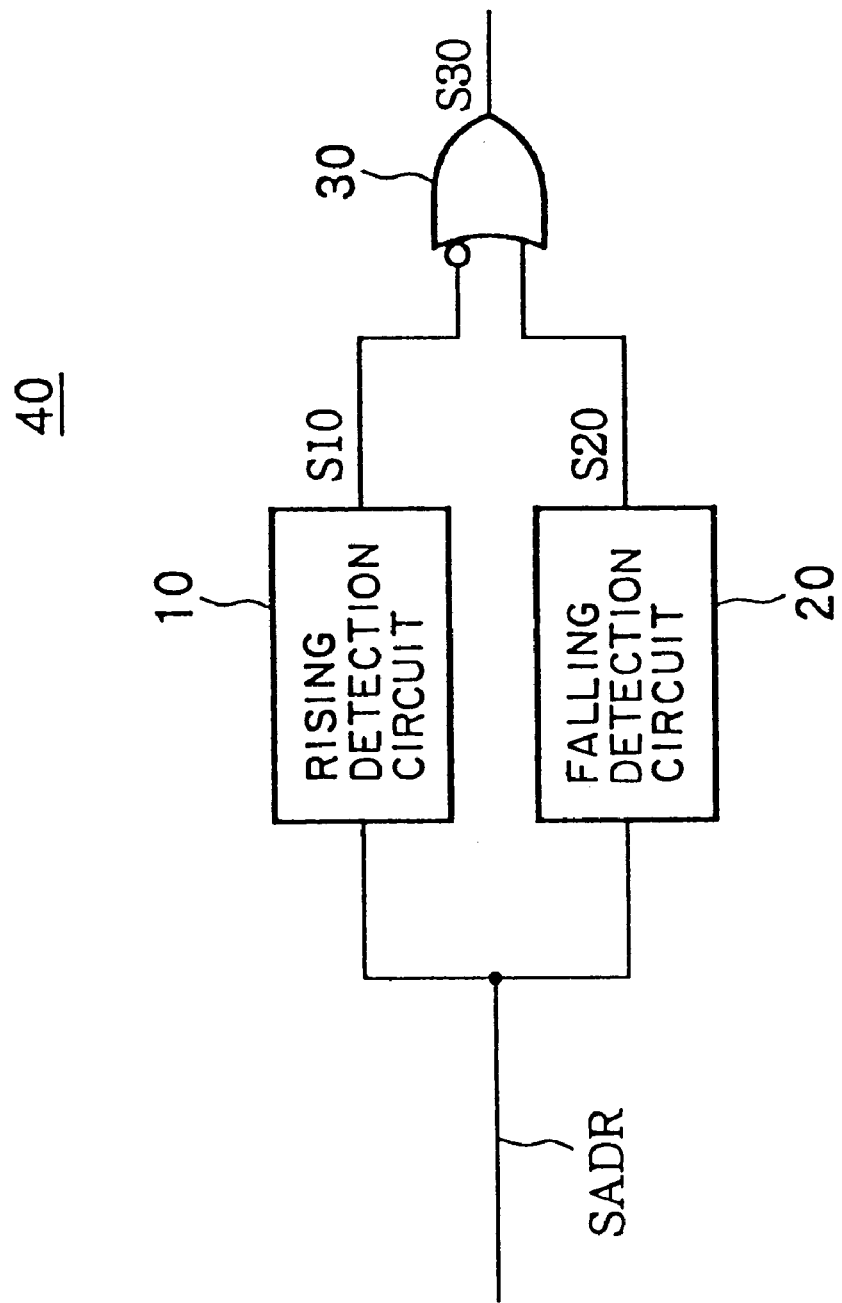

FIG. 9A SADR 
FIG. 9B S10 
FIG. 9C S20 
FIG. 9D S30 

6,081,144

SIGNAL CHANGE DETECTION CIRCUIT

BACKGROUND OF THE INVENTION

1. Field of the Invention

The present invention relates to a signal change detection circuit for detecting the change of one signal of a rising or a falling of an input signal, and generating a pulse signal having a predetermined pulse width.

2. Description of the Related Art

In an integrated circuit operating in synchronization with a synchronization signal input from an external portion, for example, a clock signal, a pulse having a constant width is sometimes generated in an internal portion in synchronization with the external clock signal. In general, such a function can be realized by a monostable multi-vibrator. The monostable multi-vibrator generates a pulse having an intended width not depending upon the waveform of the external clock signal, but in synchronization with a level change edge of the external clock signal, for example, a rising edge or a trailing edge. The stability of the operation of the internal circuit can be improved by generating the pulse inside the LSI in synchronization with the external clock signal in this way and controlling the internal operation of the LSI in accordance with this.

Some of factors behind fluctuation of the external clock signal waveform are the usage conditions, properties of the apparatus, noise, etc. For example, a frequency of the external clock signal, duty ratio, high level voltage, and low level voltage change in accordance with the usage conditions of the LSI. Alternatively, the rising time and falling time of the external clock signal are influenced by the properties of the apparatus. Further, the waveform of the external clock signal is sometimes corrupted by noise such as ringing, overshoot, and undershoot.

The fluctuation of the waveform of the external clock signal exerts an adverse influence upon the operation of the internal circuit of the LSI, and therefore is usually not preferred. For this reason, after performing processing so as to generate a pulse having a constant width in the internal portion in synchronization with the external clock signal, it is supplied to the internal circuit. Such a circuit is generally referred to as a signal change detection circuit. The monostable multi-vibrator is one example of a signal change detection circuit.

Further, conventionally, a pulse having a predetermined width was generated in synchronization with the input signal by using the signal change detection circuit shown in FIG. 14 and FIG. 16 and supplied to the internal circuit.

The circuit of FIG. 14 is constituted by an inverter INV1, a delay circuit DLY1, and an AND gate AND1. The input signal A is input to one input terminal of the AND gate AND1, inverted by the inverter INV1, further delayed by a predetermined delay time td by the delay circuit DLY1, and then input to the other input terminal of the AND gate AND1. For this reason, as shown in FIG. 15A, where the input signal A has a constant width, a pulse C having a width set by the delay time td of the delay circuit DLY1 is generated.

On the other hand, where the width of an input signal A' is shorter than the delay time td of the delay circuit DLY1, as shown in FIG. 15B, a pulse C' having a narrower width than td is generated and a normal output is not obtained. In order to solve this problem, it can be considered to once extend the width of the high level of the external clock signal. FIG. 16 shows an example of the signal change detection circuit provided with such a function.

The signal change detection circuit shown in FIG. 16 is constituted by a delay circuit DLY2, an OR gate OR1, an inverter INV2, a delay circuit DLY3, and an AND gate AND2.

When defining the width of the input signal A as tCH and the delay time of the delay circuit DLY2 as td1, as shown in FIG. 17, a pulse C having a width (tCH+td1) is generated by the delay circuit DLY2 and the OR gate OR1.

A pulse E having a constant width is generated by the signal change detection circuit comprising the inverter INV2, the delay circuit DLY3, and the AND gate AND2 with respect to a pulse C having the extended width. Here, for example, when defining the delay time of the delay circuit DLY3 as td2, as shown in FIG. 17, a pulse E having a width td2 is generated. Then, even in a case where the width of the input signal A is narrow, by setting the delay time td1 of the delay circuit DLY2 sufficiently long, a pulse E having a normal width can be generated. Namely, the problem possessed by the signal change detection circuit shown in FIG. 14 can be avoided to a certain extent.

Here, when defining the period of the input signal A as tCP, the condition of normal operation of the signal change detection circuit of FIG. 16 is given by the next equation.

$$td2-td1<tCH<tCP-td1 \qquad (1)$$

In the conventional signal change detection circuit, there is a disadvantage that the number of stages of the circuit becomes large in order to realize a certain operation and the delay time of the output signal becomes large with respect to the input signal. For example, for the purpose of outputting data from the rising edge of the clock signal at a high speed, for example, the clock access time of a synchronous type SRAM, it is important to transmit the internal clock signal with a small number of stages and it is important to reduce the signal delay due to the provision of the signal change detection circuit as much as possible.

SUMMARY OF THE INVENTION

The present invention was made in consideration with such a circumstance and has as an object thereof to provide a signal change detection circuit capable of generating a stable pulse without depending upon the waveform of the input clock signal and capable of generating a pulse at a high speed.

To achieve the above object, according to a first aspect of the present invention, there is provided a signal change detection circuit of the present invention having an input signal terminal, a set/reset flip-flop means designating one terminal among a set input terminal and a reset input terminal as a priority input terminal, a delaying means with an input terminal which is coupled with an output of the set/reset flip-flop, and a signal transfer controlling means having a control terminal, holding an input signal in response to a control signal of a first level input to the control terminal, transferring the input signal in response to a control signal of a second level input to the control terminal, and selectively transferring only the input signal having either level of the first level or the second level; the signal change detection circuit being constituted so that the output terminal of the signal change detection signal is connected to the output of the signal transfer controlling means, the input signal terminal is connected to the priority input terminal of the set/reset flip-flop means and the control terminal of the signal transfer controlling means, and the output of the signal transfer controlling means is connected to the other input terminal of the set/reset flip-flop means;

and generating a pulse signal having a predetermined width in accordance with the change of the input signal from the first level to the second level and suppresses the generation of the pulse signal with respect to a change of the input signal from the second level to the first level.

Further, in the present invention, preferably a signal holding means for holding one of the first level or second level of the output signal of the signal transfer controlling means is further provided. Further, preferably, it is constituted so that, as the signal transfer controlling means for performing clock control for only the transfer of an input signal having one level between the first level and the second level and allowing the input signal having the other level to pass therethrough, a transistor for clock input is provided between the output terminal of a CMOS inverter and one power supply terminal.

Further, in the present invention, a set/reset flip-flop equipped with a priority input is constituted between the power supply terminal and a ground terminal by connecting two transistors—the driving capability of one of which being set larger than that of the other—in series.

Further, in the present invention, further provision is made of a first detection circuit for detecting a rising edge of the input signal, a second detection circuit for detecting a trailing edge of the input signal, and a logic circuit for outputting an OR logic of the detection signals of the first and second detection circuits.

Further, preferably, the input signal is an address transition signal indicating the change of the address signal.

To attain the above object, according to a second aspect of the present invention, there is provided a signal change detection circuit for generating a pulse signal having a predetermined pulse width in accordance with an input clock signal, having a clock controlled inverting means for inverting an input signal at an input timing of the clock signal and outputting the inverted signal; a level setting means for holding the output signal at a first level in response to the input timing of the clock signal and holding the output signal at a second level in response to the input timing of the output signal of the clock controlled inverting means; and a delaying means for delaying the output signal of the level setting means by exactly a predetermined delay time and outputting the delayed signal as the input signal of the clock controlled inverting means.

Further, in the present invention, preferably further provision is made of a first data holding means for holding the output signal of the clock controlled inverting means, the first data holding means holds the first level when the output signal of the clock controlled inverting means is held at the first level.

Further, in the present invention, preferably further provision is made of a second data holding means for holding the output signal level of the level setting means, and the second data holding means holds the second level when the output signal of the level setting means is held at the second level.

Further, in the present invention, when the clock signal input and the output signal of the clock controlled inverting means are input to the level setting means in competition, the level setting means sets the output signal level while giving priority to the output signal of the clock controlled inverting means.

According to the present invention, the input signal is inverted at the input timing of the clock signal and output by the clock controlled inverting means. The output signal level of the level controlling means is held at the second level in accordance with the inverted signal, and the output signal level of the level controlling means is held at the first level in accordance with the input timing of the clock signal. The level change edge of the output signal of the level controlling means, for example, the change edge from the first level to the second level, is delayed, and the delayed signal is input to the clock controlled inverting means. The output signal of the clock controlled inverting means is supplied as the output pulse of the signal change detection circuit to for example, the internal circuit.

By this, a stable pulse can be generated not depending upon the waveform of the input signal and, further, the number of gates from the clock input to the output of the pulse is small, and the pulse can be generated at a high speed.

BRIEF DESCRIPTION OF THE DRAWINGS

These and other objects and features of the present invention will become clearer from the following more detailed description of the related art and description of the preferred embodiments given with reference to the attached figures, in which:

FIGS. 4A to 4D are timing charts of the operation of the signal change detection circuit of FIG. 3.

FIG. 8 is a circuit diagram of an address transition detection circuit.

FIGS. 9A to 9D are timing charts of the operation of the address transistion detection circuit of FIG. 8.

DESCRIPTION OF THE PREFERRED EMBODIMENTS

First embodiment

Figure 1:
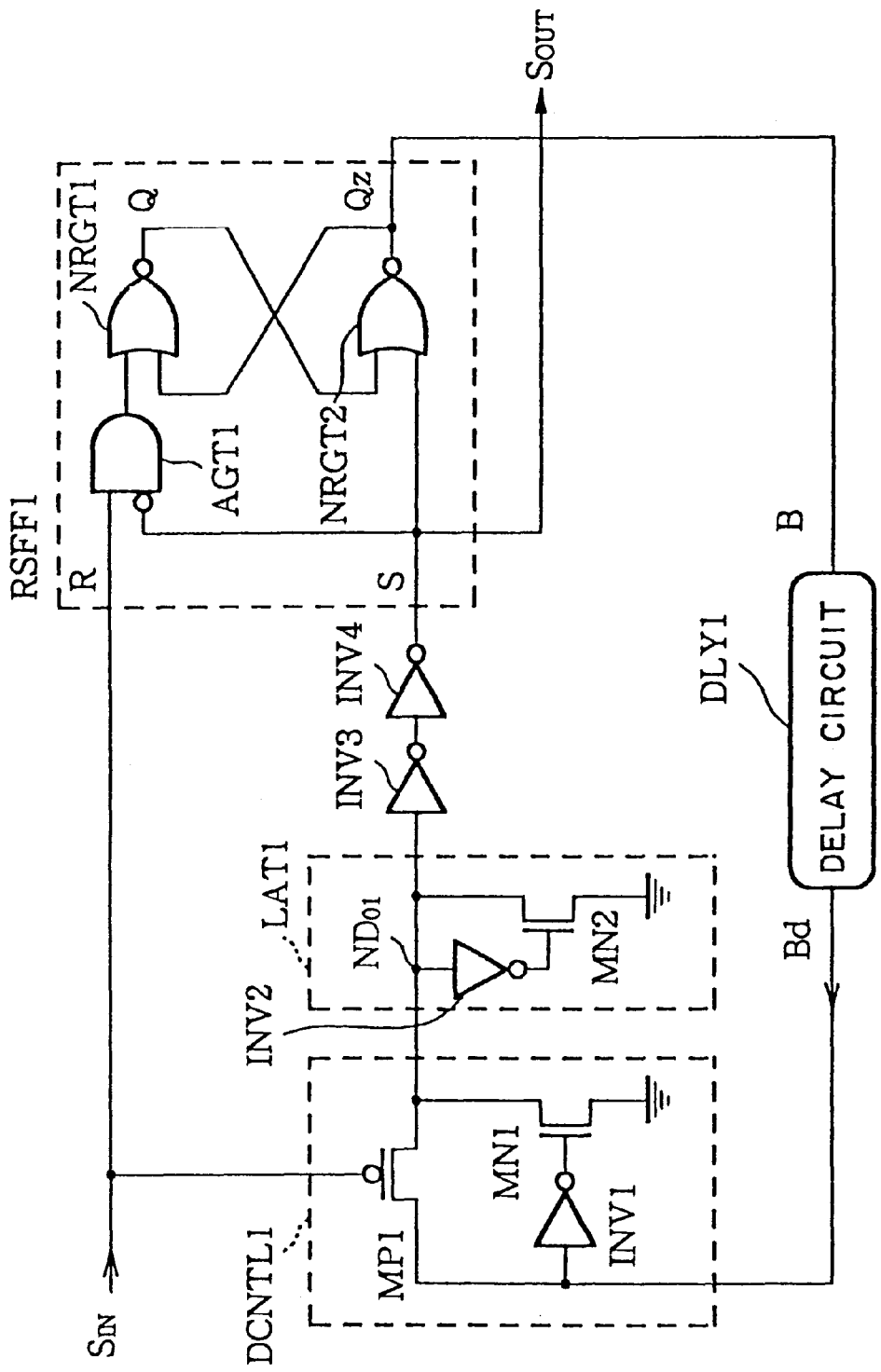
FIG. 1 is a circuit diagram of a first embodiment of a signal change detection circuit according to the present invention.
Figure 2:
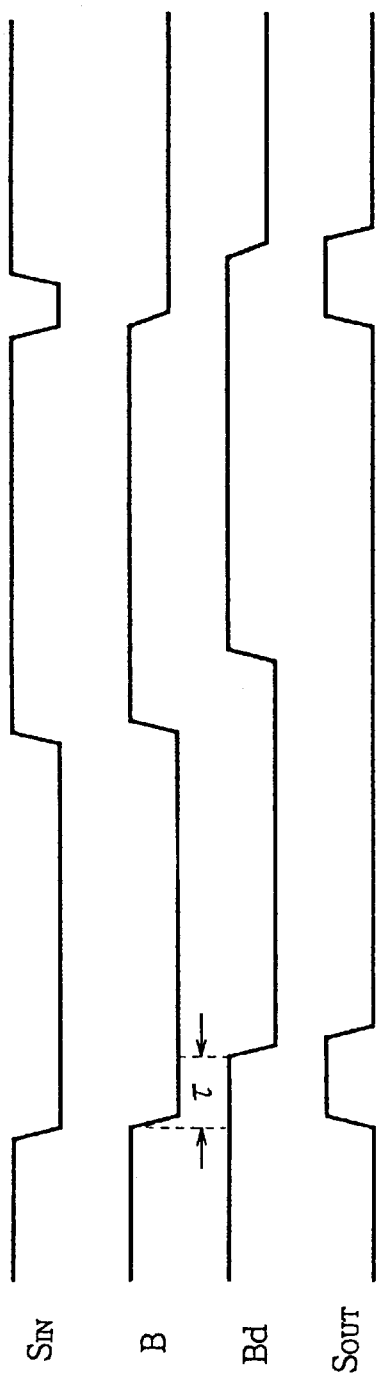
FIGS. 2A to 2D are timing charts of the operation of the signal change detection circuit of FIG. 1.

FIG. 1 is a circuit diagram of a first embodiment of the signal change detection circuit according to the present invention.

As illustrated, the signal change detection circuit of the present example is constituted by a set-priority set/reset flip-flop (hereinafter simply referred to as a flip-flop) RSFF1, a delay circuit DLY1, a signal transfer control circuit DCNTL1 for performing the clock control for the high level signal and allowing the signal of the low level to pass therethrough, and a latch circuit LAT1 for holding the signal level of an internal node ND01 of the signal change detection circuit.

Further, the transfer control circuit DCNTL1 is constituted by a p-channel MOS transistor (hereinafter simply referred to as a pMOS transistor) MP1 which is controlled by the input signal SIN and an n-channel MOS transistor (hereinafter simply referred to as an nMOS transistor) MN1 for allowing the data signal of the low level to pass therethrough by controlling the gate by the inverted signal of the data signal when the data signal is at the low level.

The input signal SIN is connected to a reset input terminal R of the flip-flop RSFF1 and, at the same time, connected to the gate of the pMOS transistor MP1 constituting the transfer control circuit DCNTL1 and an nMOS transistor MN2 constituting the latch circuit LAT1. A signal Bd obtained by delaying a signal B output from the inversion output terminal Qz of the flip-flop RSFF1 by the delay circuit DLY1 is input to the data input terminal of the transfer control circuit DCNTL1. The output terminal of the transfer control circuit DCNTL1 is connected to the set input terminal S of the flip-flop RSFF1 via two stages of inverters INV3 and INV4 connected in series.

The latch circuit LAT1 is a circuit for holding the output of the transfer control circuit DCNTL1 and is constituted by an inverter INV2 for inverting the signal level of the node ND01 and a nMOS transistor MN2 which is connected between the node ND01 and the ground terminal, receives the output signal of the inverter INV2, and holds the "0" level of the node ND01, that is, the low level.

FIGS. 2A to 2D are timing charts for explaining the operation of the signal change detection circuit of the present embodiment.

Below, an explanation will be made of the operation of the signal change detection circuit constituted as described above by referring to FIGS. 2A to 2D. In FIGS. 2A to 2D, when the input signal SIN is at the high level, the pMOS transistor MP1 of the transfer control circuit DCNTL1 is held in the OFF state, and the node ND01 is in a floating state. At this time, in the latch circuit LAT1, due to a parasitic capacitance of the nMOS transistor MN2, the voltage of the node ND01 is pulled down to the ground voltage GND. When the voltage of the node ND01 becomes lower than the threshold voltage of the inverter INV2, the output terminal of the inverter INV2 is held at a high level, the nMOS transistor MN2 turns ON, and the node ND01 is held at the ground voltage GND. According to this, an output signal SOUT is set at the low level. Accordingly, since the set input S of the flip-flop RSFF2 is at the low level, the reset input R thereof becomes valid. When the input signal SIN is at the high level, the inversion output terminal Qz of the flip-flop RSFF2 is held at the high level. Namely, the input signal B of the delay circuit DLY1 is at the high level, and also the output signal Bd thereof is held at the high level.

Subsequently, when the input signal SIN changes from "1" to "0", that is, from the high level to the low level, in the transfer control circuit DCNTL1, the pMOS transistor MP1 becomes conductive and the output is inverted to "1". Further, by the change of the output signal SOUT, that is, the set input S of the flip-flop RSFF1, to "1", the flip-flop RSFF1 is set, and the inverted output signal B changes to "0". The signal Bd obtained by delaying the signal B is inverted to "0" with a delay of exactly a delay time of the delay circuit DLY1. When the output signal Bd of the delay circuit DLY1 is inverted to "0", the transfer control circuit DCNTL1 allows the signal "0" to pass therethrough irrespective of the signal level of the input signal SIN, whereby the output signal SOUT of the signal change detection circuit is inverted to "0", and outputs a pulse of a width substantially corresponding to the delay time of the delay circuit DLY1. Namely, the circuit shown in FIG. 1 operates as a signal change detection circuit for detecting the signal change (trailing edge) of the input signal SIN from "1" to "0".

Note that, it is easily seen that, even if a latch circuit LAT1 is not particularly provided, if for example the signal level of the node ND01 is initially set in a period of one cycle of the input signal after turning on the power supply and the period of the high level of the input signal SIN is short, the signal level of the node ND01 is held. Accordingly, the latch circuit LAT1 is not an essential requirement of the signal change detection circuit of the present invention. It is also possible to omit the latch circuit.

Second embodiment

Figure 3:
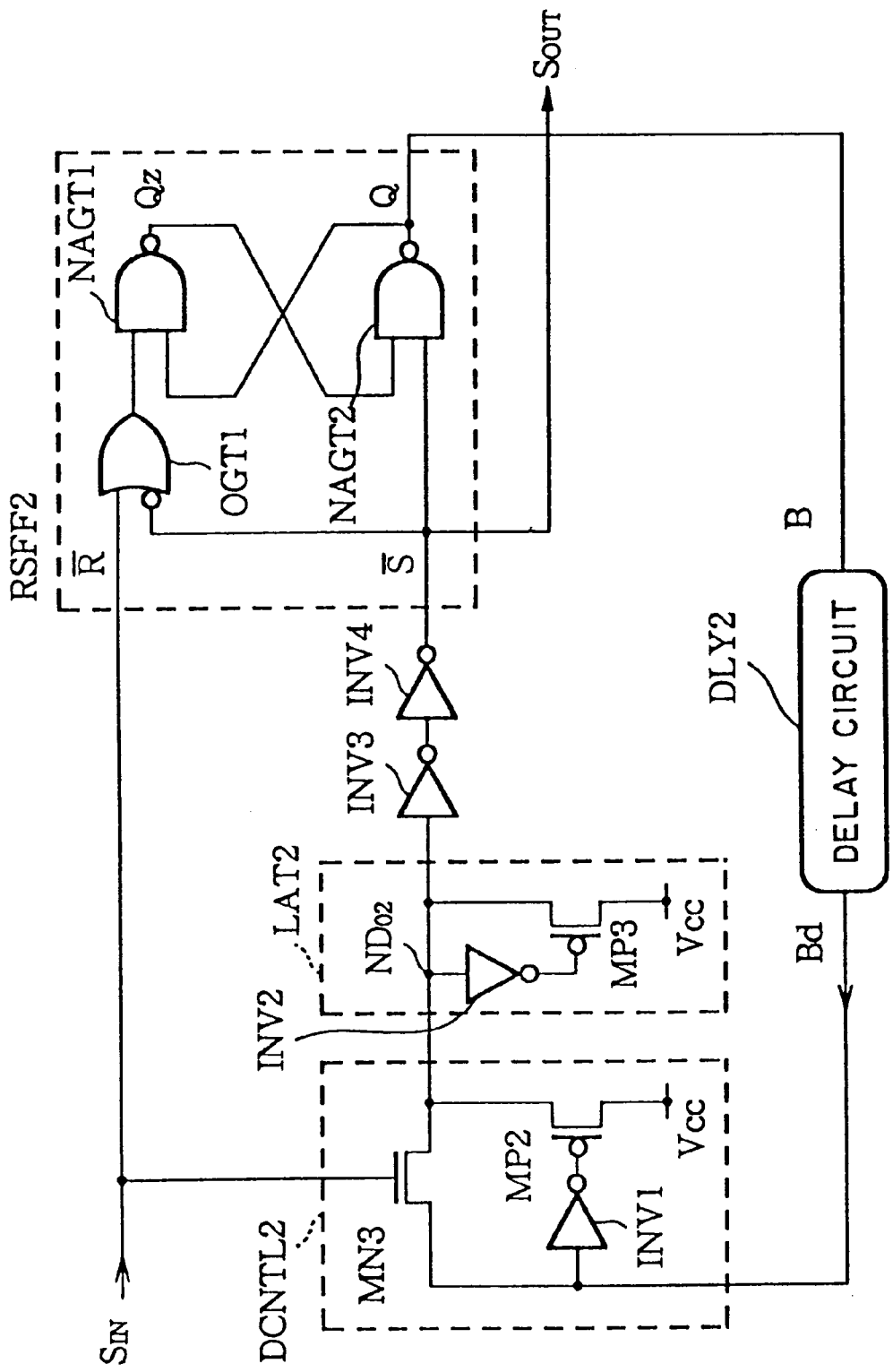
FIG. 3 is a circuit diagram of a second embodiment of the signal change detection circuit according to the present invention.

FIG. 3 is a circuit diagram of a second embodiment of the present invention. In the present embodiment, the difference from the first embodiment resides in that the polarities of the input and output of the flip-flop RSFF2 become reverse to those of the first embodiment, the transfer control circuit DCNTL2 allows the data signal to pass therethrough when the input signal SIN is at the "1" level and unconditionally allows the "1" level of the data signal to pass therethrough, and the latch circuit LAT2 holds the "1" level of the node ND02, that is, the high level.

As shown in FIG. 3, in the present embodiment, the transfer control circuit DCNTL2 and the latch circuit LAT2 can be constituted so that the nMOS transistors MN1 and MN2 of the transfer control circuit DCNTL1 and the latch circuit LAT1 in the first embodiment shown in FIG. 1 are respectively replaced by pMOS transistors MP2 and MP3, the pMOS transistor MP1 is replaced by the nMOS transistor MN3, and the sources of transistors MP2 and MP3 are connected to the power supply voltage VCC.

In the flip-flop RSFF2, the constituent elements is different from those of the flip-flop RSFF1 of the first embodiment. The flip-flop RSFF2 is constituted by an OR gate OGT1 and NAND gates NAGT1 and NAGT2.

FIGS. 4A to 4D are timing charts showing the operation of the present embodiment. As illustrated, the signal change detection circuit of the present embodiment detects the level change of the input signal at exactly a reverse polarity to that of the first embodiment and generates the signal change detection signal SOUT. Details of the operation are substantially the same as those of the first embodiment. Below, an explanation will be made of the operation of the signal change detection circuit of the present embodiment by referring to FIGS. 4A to 4D.

When the input signal SIN is at the low level, an nMOS transistor MN3 of the transfer control circuit DCNTL2 is held in the OFF state, and the node ND02 is in the floating state. At this time, in the latch circuit LAT2, due to the parasitic capacitance of the pMOS transistor MP3, the voltage of the node ND02 is pulled up by the power supply voltage VCC. When the voltage of the node ND02 exceeds the threshold voltage of the inverter INV2, the output terminal of the inverter INV2 is held at the low level, the pMOS transistor MP3 becomes ON in response to this, and the node ND02 is held at the power supply voltage VCC. According to this, the output signal SOUT is set at the high level. Further, when the input signal SIN is at the low level, the output terminal Q of the flip-flop RSFF2 is held at the low level. Namely, the input signal B of the delay circuit DLY2 is at the low level, and also the output signal Bd thereof is held at the low level.

When the input signal SIN switches from the low level to the high level, at the transfer control circuit DCNTL2, the nMOS transistor MN3 is switched from OFF state to ON state, and the node ND02 of the latch circuit LAT2 switches to the low level. According to this, the output signal SOUT switches from the high level to the low level. Further, the output terminal Q of the flip-flop RSFF2 switches from the low level to the high level, therefore, after an elapse of the delay time of the delay circuit DLY2, also the output signal Bd thereof is switched to the high level. In the transfer control circuit DCNTL2, when the signal Bd of the high level is input, the output terminal of the inverter INV1 is held at the low level, and the pMOS transistor MP2 becomes ON. For this reason, irrespective of the level of the input signal SIN, the node ND02 of the latch circuit LAT2 is held at the high level, and also the output signal SOUT switches from the low level to the high level according to this.

Namely, as shown in FIGS. 4A to 4D, by the signal change detection circuit of the present embodiment, the signal change of the input signal SIN from the low level to the high level, that is, the rising edge of the input signal SIN, is detected, and the negative pulse signal SOUT having the predetermined width set by the delay time of the delay circuit DLY2 is output in accordance with this.

Third embodiment

Figure 5A:
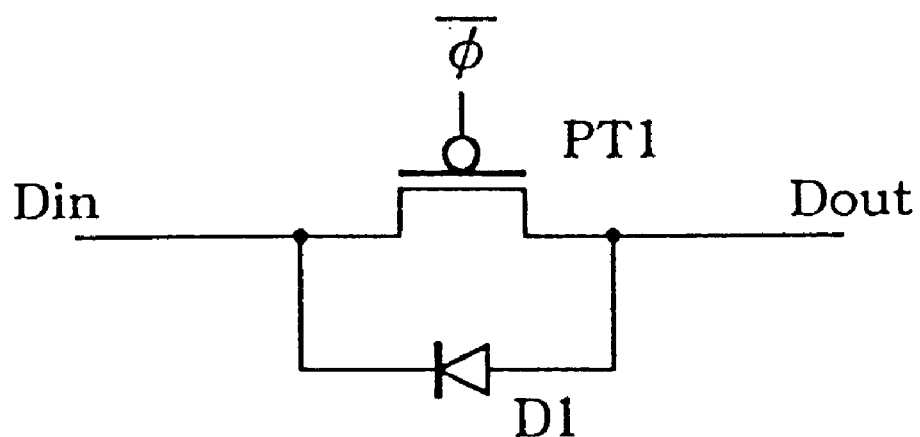
FIGS. 5A and 5B are circuit diagrams of modifications of a transfer control circuit.
Figure 5B:
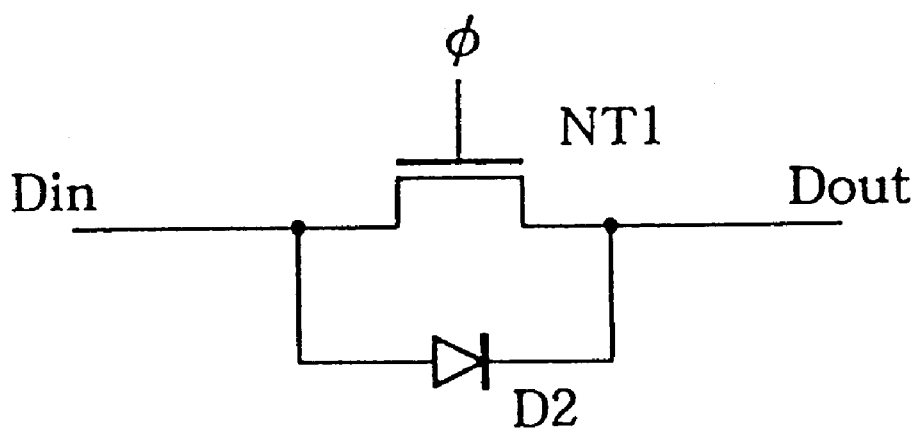

FIGS. 5A and 5B are circuit diagrams of a third embodiment of the signal change detection circuit according to the present invention and is a circuit diagram showing a modification of the transfer control circuit.

The transfer control circuit shown in FIG. 5A is constituted by a pMOS transistor PT1 and a diode D1. The transfer control circuit of the present example transfers an input Din to an output Dout when a clock signal is at the low level and, at the same time, transfers the input Din to the output Dout when the input Din is at the low level.

The transfer control circuit shown in FIG. 5B is constituted by an NMOS transistor NT1 and a diode D2. The transfer control circuit of the present example transfers the input Din to the output Dout when the clock signal is at the high level and, at the same time, transfers the input Din to the output Dout when the input Din is at the high level.

The transfer control circuit of the present example is preferred when applied to the second embodiment shown in FIG. 3.

Note that, as the diodes D1 and D2 in FIG. 5A and FIG. 5B, it is also possible to use a pn junction diode, a diode connection MIS transistor, and other element having a rectification function. Where an MIS transistor is used, for example, an n-channel MIS transistor is used, a drain electrode and a gate electrode are commonly connected to a positive polarity side, and a negative polarity side becomes the source electrode. When a p-channel MIS transistor is used, it is formed in so that the positive polarity side is used as the source electrode, and the drain electrode and the source electrode are commonly connected to the negative polarity side.

Fourth embodiment

Figure 6A:
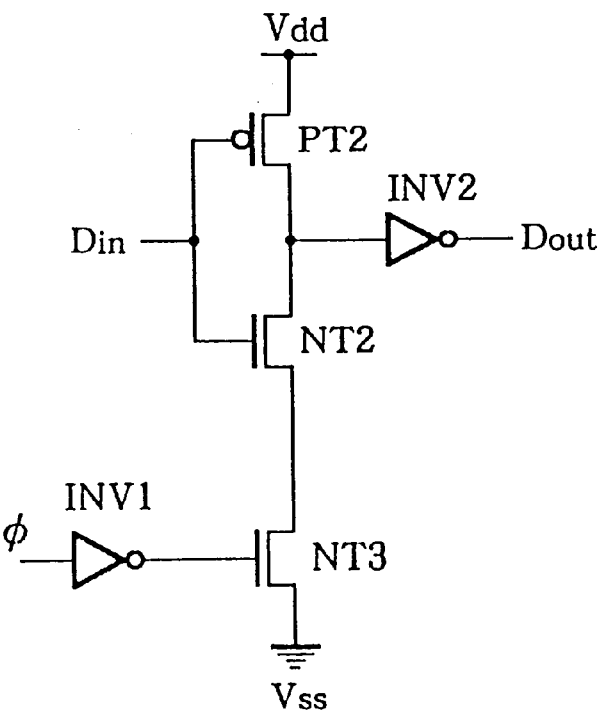
FIGS. 6A and 6B are circuit diagrams of other modifications of the transfer control circuit.
Figure 6B:
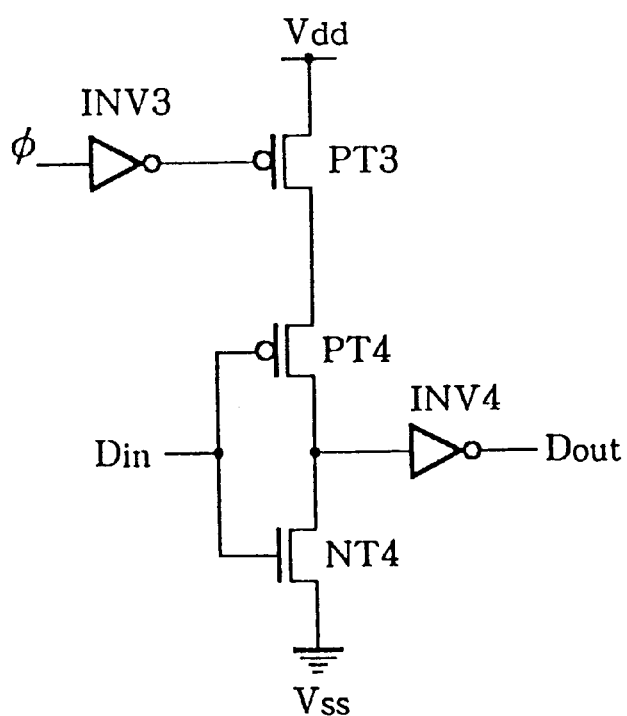

FIGS. 6A and 6B show some other modifications of the transfer control circuit.

FIG. 6A shows an example of a circuit for transferring the input to the output when the clock is at the low level and transferring the input to the output not according to the level of when the input Din is at the low level. The transfer control circuit of the present example is preferred when applied to the first embodiment.

FIG. 6B shows an example of the circuit for transferring the input to the output when the clock is the high level and transferring the input to the output not according to the level of when the input Din is at the high level. The transfer control circuit of the present example is preferred when applied to the second embodiment.

Fifth embodiment

Figure 7A:
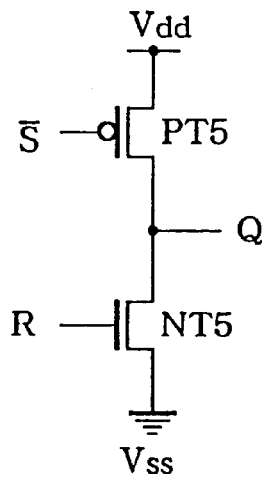
FIGS. 7A to 7C are circuit diagrams of modifications of a flip-flop.
Figure 7B:
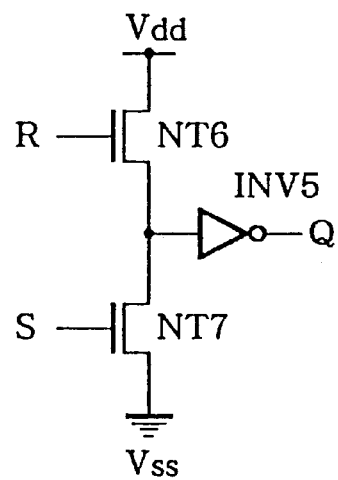
Figure 7C:
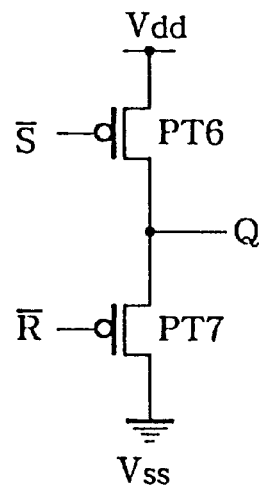

Example of the set/reset flip-flop equipped with priority input are shown in FIGS. 7A to 7C.

FIG. 7A becomes a case where both of set priority and reset priority can be achieved by setting the driving capability of the transistor on the priority input side larger than that of the other.

FIGS. 7B and 7C show examples where the other input becomes the priority input with respect to the input of a source follower side. Usually, the ratio of the driving capability can be sufficiently obtained even if transistors having the same size are used.

Sixth embodiment

FIG. 8 is a circuit diagram of a sixth embodiment of the present invention.

As illustrated, in the present embodiment, by providing signal change detection circuits 10 and 20 for detecting the rising edge and trailing edge of an input signal SADR and taking the AND logic of the detection signals of these signal change detection circuits, a signal change detection circuit 40 for detecting both of the rising edge and trailing edge of the input signal SADR can be realized.

The first and second embodiments shown in FIG. 1 and FIG. 3 are signal change detection circuits for detecting the rising edge and trailing edge of the signal, respectively, and cannot simultaneously detect both of the rising edge and trailing edge of the input signal SADR.

Note that, here, the input signal SADR is a clock signal for controlling for example a synchronous type memory or a control signal for switching the mode of the memory.

FIG. 8 shows a circuit applying the first and second embodiments of the present invention to an address transition detection circuit, in which the signal change detection circuit (rising detection circuit) 10 is similar to the second embodiment shown in FIG. 3, detects the rising edge of the address input signal SADR, and outputs a negative pulse signal S10 of a width τ, and the signal change detection circuit (falling detection circuit) 20 is similar to the first embodiment shown in FIG. 1, detects the trailing edge of the address input signal SADR, and outputs a positive pulse signal S20 of the width.

The output signal S10 of the signal change detection circuit 10 is inverted and input to one input terminal of the OR gate 30, while the output signal S20 of the signal change detection circuit 20 is input as it is to the other input terminal of the OR gate 30. As a result, pulse signals of width τ are output with respect to both of the rising edge and trailing edge of the address input signal SADR, and the change of the address signal can be detected. Namely, by the circuit shown in FIG. 8, an address transition detection circuit ATD (address transition detector) for detecting the change of the address signal can be constituted.

FIGS. 9A to 9D are waveform diagrams of the operation of the present embodiment.

As illustrated, in the address transition detection circuit 40, the address signal SADR is input to the signal change detection circuits 10 and 20. By these signal change detection circuits 10 and 20, both the rising and trailing edges of the address signal SADR are detected, and a pulse signal S30 indicating the level change of the signal is obtained by the OR gate 30.

Seventh embodiment

Figure 10:
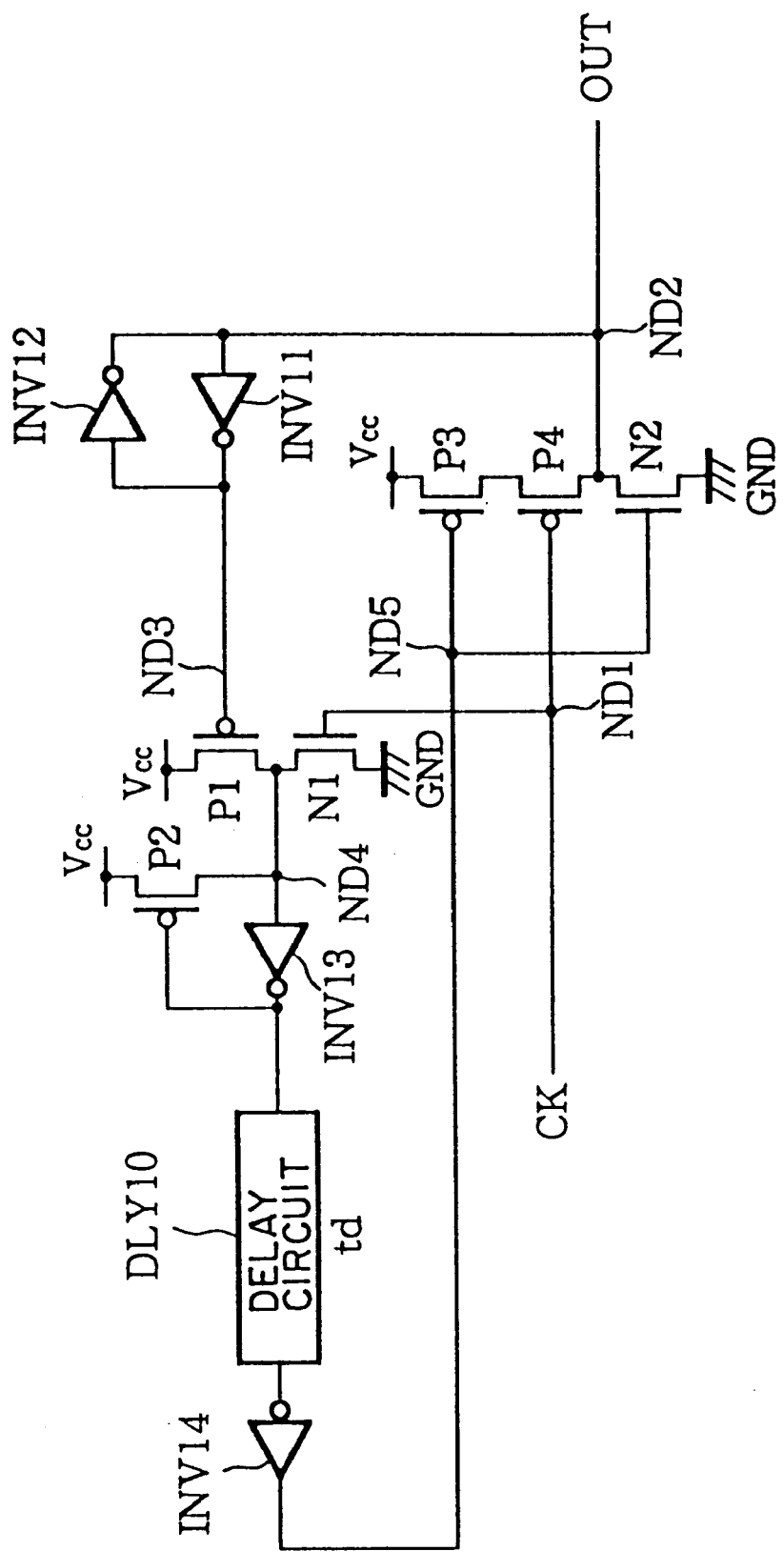
FIG. 10 is a circuit diagram of a seventh embodiment of the signal change detection circuit according to the present invention.

FIG. 10 is a circuit diagram of a seventh embodiment of the signal change detection circuit according to the present invention.

As illustrated, the signal change detection circuit of the present example is constituted by a level setting means comprising a PMOS transistor P1 and an nMOS transistor N1, a data holding circuit comprising a pMOS transistor P2 and an inverter INV13 (second data holding means), a delay circuit DLY10, an inverter INV14, a clock controlled inverting means comprising pMOS transistors P3 and P4 and an nMOS transistor N2, and a data holding circuit (first data holding means) comprising inverters INV11 and INV12.

The pMOS transistors P3 and P4 and the nMOS transistor N2 are connected in series between a supply line of a power supply voltage VCC and a ground voltage GND. Further, the gate of the pMOS transistor P3 and the gate of the nMOS transistor N2 are connected to the output terminal of the inverter INV4, that is, a node ND5, and the gate of the pMOS transistor P4 is connected to the node ND1, that is, the input terminal of a clock signal CK.

The drain of the pMOS transistor P4 and the drain of the nMOS transistor N2 are commonly connected to a node ND2. The node ND2 forms an output terminal of the clock controlled means. The clock controlled means constituted in this way inverts the signal level of the node ND5 and outputs it to the node ND2 when the clock signal CK is at the low level. When the clock signal CK is the high level, the signal level right before the node ND2 is held.

Further, when the node ND5 is the high level, the nMOS transistor N2 is held in the ON state and the node ND2 is held at the low level.

The clock controlled inversion means constituted in this way outputs an input signal inverted in accordance with the input timing of the clock signal CK, so is also called a clocked inverter.

An output signal OUT of the node ND2 is held by the data holding circuit comprising the inverters INV1 and INV2. Then, the held signal is output to the node ND3.

In the level setting means, the pMOS transistor P1 and the nMOS transistor N1 are connected in series between the power supply voltage VCC and the ground voltage GND. The gate of the pMOS transistor P1 is connected to the node ND3, and the gate of the nMOS transistor N1 is connected to the node ND1, that is, the input terminal of the clock signal CK. Drains of the pMOS transistor P1 and the nMOS transistor N1 are commonly connected, and a node ND4 is formed by this connecting point. Note that, the node ND4 functions as the output terminal of the level setting means.

In the level setting means constituted in this way, for example, when the node ND3 is at the low level, the pMOS transistor P1 is in the ON state, and the node ND4 is held at the high level, for example, the power supply voltage VCC level. On the other hand, when the clock signal CK is at the high level, the nMOS transistor N1 is in the ON state, and the node ND4 is held at the low level, for example, the ground voltage GND level.

Note that, when the signal level of the node ND3 and the level of the clock signal CK are input to the level setting means in competition, that is, when the node ND3 is held at the low level and the clock signal CK is held at the high level, both of the pMOS transistor P1 and the nMOS transistor N1 become ON. In the circuit structure, a driving capability of the pMOS transistor P1 is set larger than that of the nMOS transistor N1, therefore, in the above case, the output terminal ND4 of the level setting means is set at the high level. Namely, where input signals of the level setting means compete, the pMOS transistor P1 is held in the ON state with priority, and the output signal of the level setting means is held at the high level.

The signal level of the node ND4 is held by the latch circuit comprising the inverter INV3 and the PMOS transistor P2. The held signal is input to the delay circuit DLY10.

The delay circuit DLY10 delays the signal by exactly the time td with respect to the rising edge of the input signal and outputs the delayed signal. Then, the output signal of the delay circuit DLY10 is inverted by the inverter INV14 and input as the input signal of the clock controlled inverting means to the node ND5.

The seventh embodiment is essentially the same as one using a circuit replacing the RSFF1 in FIG. 1 showing the first embodiment of the present invention by the circuit shown in FIG. 7A and using a circuit replacing the DCNTL1 in FIG. 1 showing the first embodiment of the present invention by the circuit shown in FIG. 6B as the clock controlled inverting means. The difference resides in that the data holding means for holding the data is provided since the voltage of the node depends upon the capacitance held by the capacitor. This constitutes the inverter INV12 for holding the level of the node ND2 in FIG. 10 and the pMOS transistor P2 for holding the level of the node ND4. The basic operation is similar to that of the first embodiment 1, therefore a detailed explanation of the operation will be omitted.

Eighth embodiment

Figure 11:
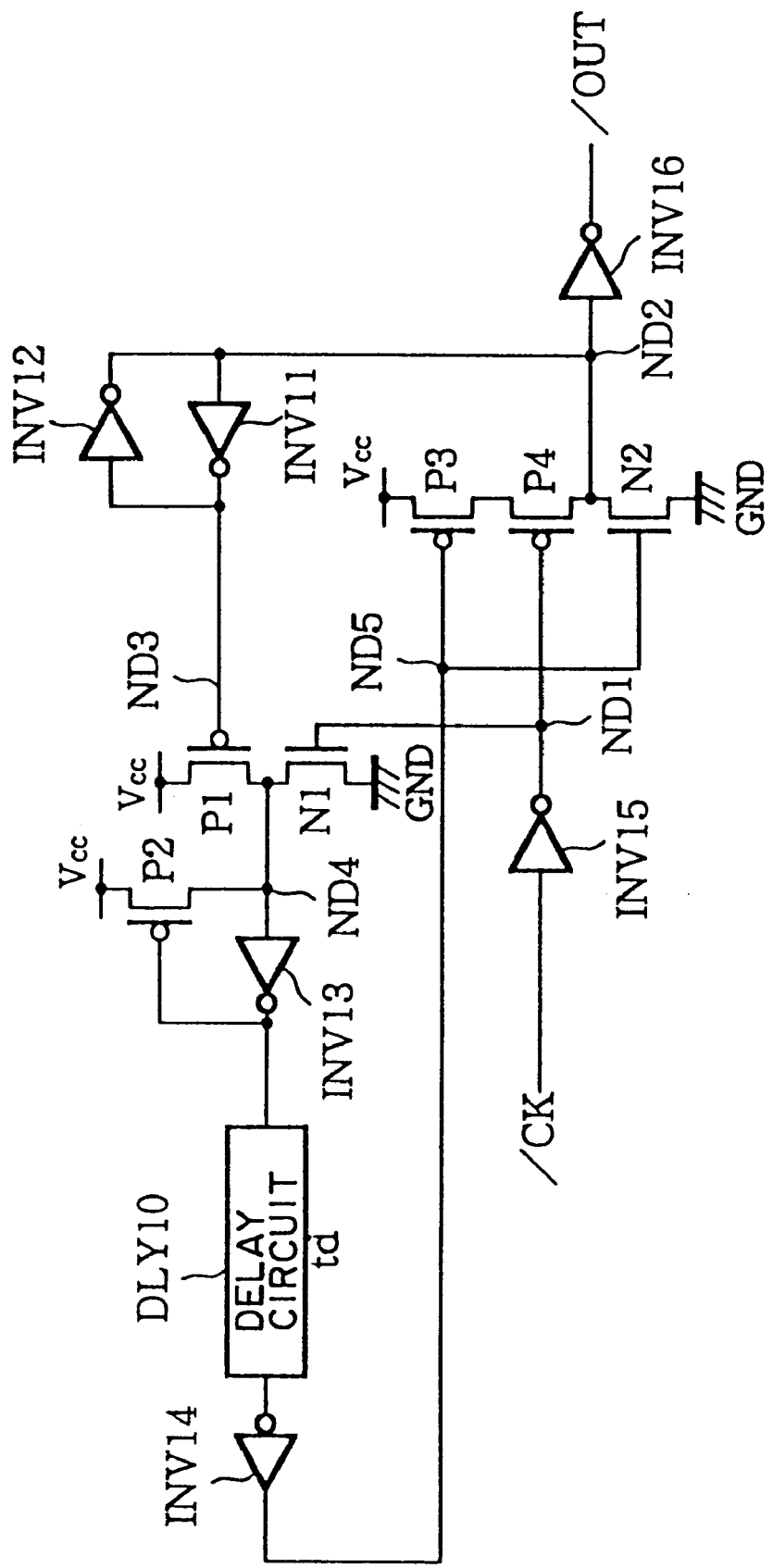
FIG. 11 is a circuit diagram of an eighth embodiment of the signal change detection circuit according to the present invention.

FIG. 11 is a circuit diagram of an eighth embodiment of the signal change detection circuit according to the present invention.

As illustrated, in the signal change detection circuit of the present embodiment, in comparison with the signal change detection circuit of the seventh embodiment shown in FIG. 10, an inverter INV15 is connected between the input terminal of the clock signal CK and the node ND1, and further an inverter INV16 is connected between the node ND2 and the output terminal of the pulse.

Note that the other constituent parts of the present embodiment are basically the same as those of the seventh embodiment shown in FIG. 10. In FIG. 11, the same constituent parts of the circuit are denoted using the same references as those in FIG. 10.

In the present embodiment, by providing the inverter INV5 at the input stage of the clock signal /CK, when the waveform of the clock signal /CK is unstable, the waveform is shaped once by a logical threshold voltage of the inverter INV15. Namely, where the level of the clock signal /CK is lower than the threshold voltage of the inverter INV15, the node ND1 is held at the high level, and where the level of the clock signal /CK exceeds the threshold voltage of the inverter INV15, the node ND1 is held at the low level. For this reason, for example, where noise of the low level is mixed in the clock signal /CK, this is eliminated to a certain extent and the influence of the noise is suppressed.

Further, even in a case where the waveform of the input clock signal /CK is corrupted by for example the characteristic of the apparatus and the rising time and the falling time are extended, by the action of the inverter INV15, the characteristic of the waveform of the node ND1 is enhanced to a certain extent and both of the rising edge and trailing edge are sharply shaped. By this, in the present embodiment, the operational stability of the signal change detection circuit is further improved.

Further, by providing the inverter INV16 on the output side of the signal change detection circuit, the generated pulse is supplied via the inverter INV16 to, for example, the internal circuit of the LSI. Therefore, the driving capability of the output pulse /OUT is improved, the influence exerted by the characteristic of the circuit being supplied upon the signal change detection circuit can be suppressed, and the operational stability of the signal change detection circuit can be improved.

Note that the operation of the signal change detection circuit of the present embodiment is substantially the same as that of the seventh embodiment, but note, in the present embodiment, the generation of the pulse starts in response to the rising edge of the clock signal CK. Namely, in comparison with the seventh embodiment, the clock signal CK is inverted and then the signal change detection circuit is driven. Similarly, the output pulse signal /OUT is inverted in its waveform in comparison with the seventh embodiment.

Ninth embodiment

Figure 12:
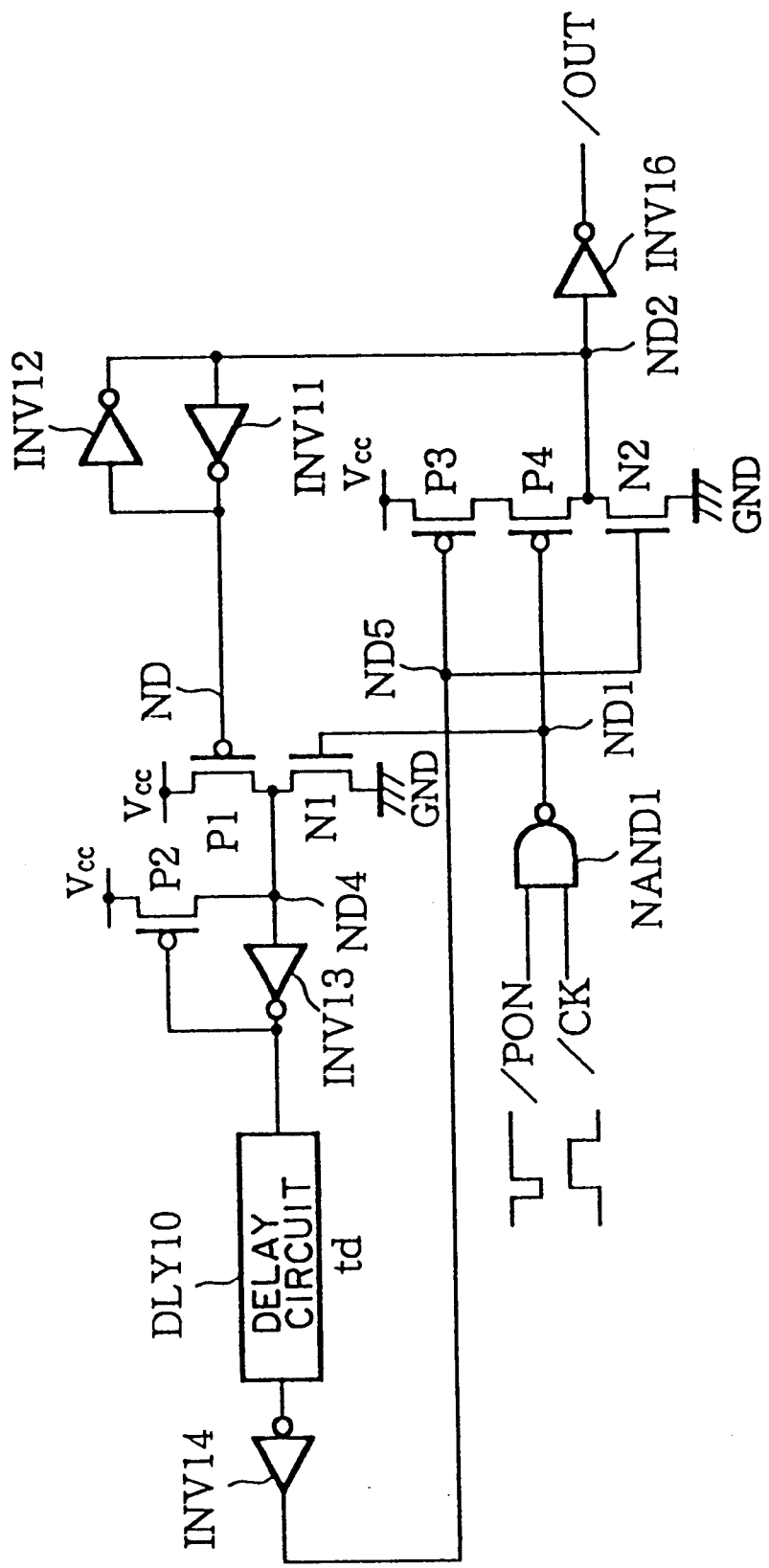
FIG. 12 is a circuit diagram of a ninth embodiment of the signal change detection circuit according to the present invention.

FIG. 12 is a circuit diagram of a ninth embodiment of the signal change detection circuit according to the present invention.

As illustrated, the difference of the signal change detection circuit of the present embodiment from the signal change detection circuit of the eighth embodiment shown in FIG. 11 resides in that the NAND1 is provided in place of the INV15 as the logic combining means for the clock signal /CK and power supply turn-on detection signal /PON and further that an inverter INV16 is connected between the node ND2 and the output terminal of the pulse.

Note that the other constituent parts of the present embodiment are basically the same as those of the eighth embodiment shown in FIG. 11. In FIG. 12, the same constituent parts of the circuit are denoted by using the same references as those of FIG. 11. Concerning the operation, it is the same as that of the eight embodiment except that, when /PON is at the "0" level, the node ND1 becomes the "1" level and the node ND4 is reset to "0".

10th embodiment

Figure 13:
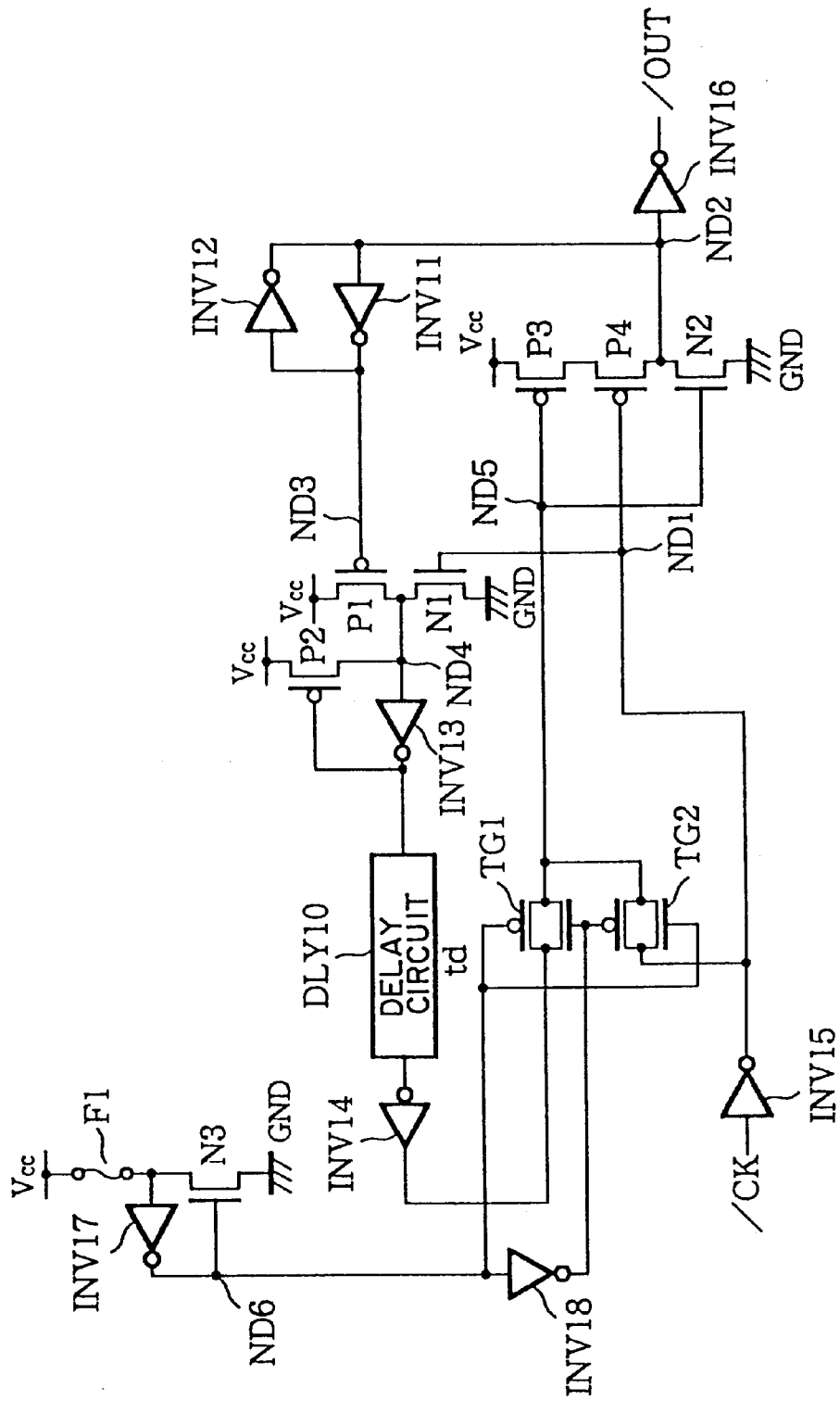
FIG. 13 is a circuit diagram of a 10th embodiment of the signal change detection circuit according to the present invention.
Figure 14:
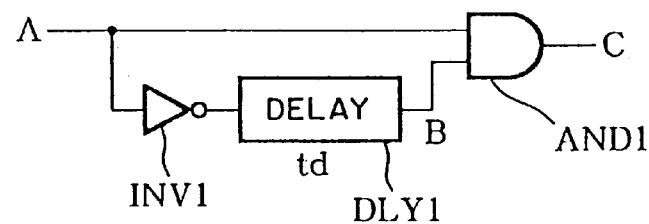
FIG. 14 is a circuit diagram of an example of a conventional signal change detection circuit.
Figure 15A:
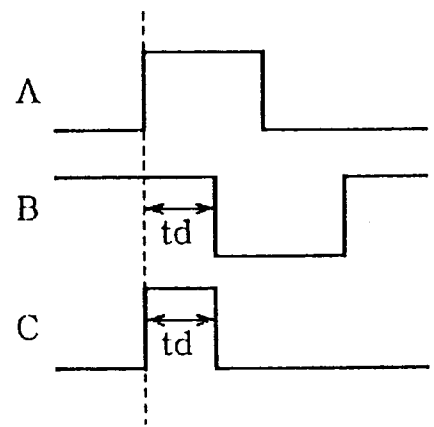
FIGS. 15A and 15B are timing charts of the operation of the signal change detection circuit of FIG. 14.
Figure 15B:
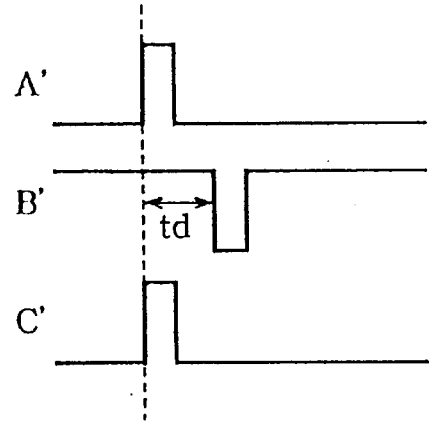
Figure 16:
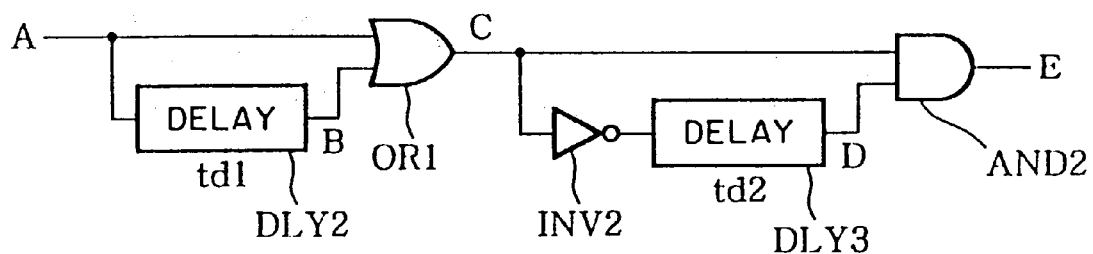
FIG. 16 is a circuit diagram of another example of the conventional signal change detection circuit.
Figure 17:
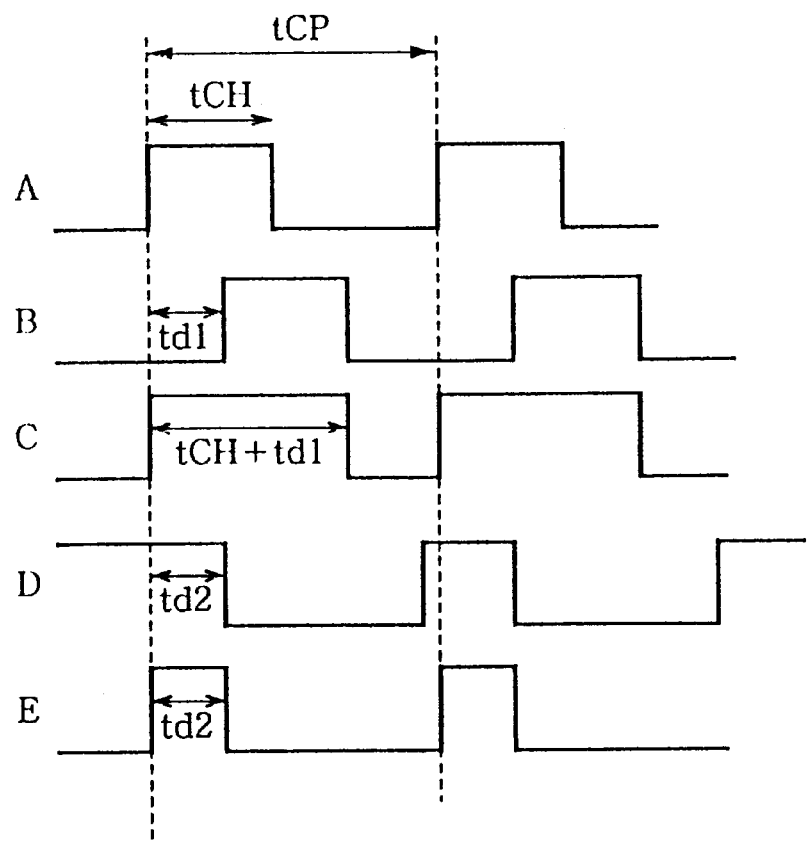
FIG. 17 is a timing chart of the operation of the signal change detection circuit of FIG. 16.

FIG. 13 is a circuit diagram of a 10th embodiment of the signal change detection circuit according to the present invention.

As illustrated, in the signal change detection circuit of the present embodiment, in comparison with the eighth embodiment of the signal change detection circuit shown in FIG. 11, transfer gates TG1 and TG2 and a fuse circuit for controlling the ON/OFF state of these transfer gates are newly provided.

The input terminal of the transfer gate TG1 is connected to the output terminal of the inverter INV14, and the output terminal is connected to the node ND5. The input terminal of the transfer gate TG2 is connected to the output terminal of the inverter INV15, and the output terminal is connected to the node ND5.

One terminal of the fuse F1 is connected to the power supply voltage VCC, and the other terminal is connected to the drain of the nMOS transistor N3. The source of the NMOS transistor N3 is grounded. Further, the input terminal of the inverter INV17 is connected to the drain of the nMOS transistor N3, and the output terminal is connected to the node ND6 together with the gate of the nMOS transistor N3.

Both of the gates of the pMOS transistor constituting the transfer gate TG1 and the nMOS transistor constituting the transfer gate TG2 are connected to the node ND6, and both of the gates of the nMOS transistor constituting the transfer gate TG1 and the pMOS transistor constituting the transfer gate TG2 are connected to the output terminal of an inverter INV18. Note that, the input terminal of the inverter INV18 is connected to the node ND6.

For this reason, in a state where the fuse F1 is connected, the node ND6 is held at the low level, and the output terminal of the inverter INV18 is held at the high level. The transfer gate TG1 is set in the ON state, and the transfer gate TG2 is set in the OFF state.

By this, the signal change detection circuit of the present embodiment has almost the same structure as that of the eighth embodiment shown in FIG. 11 and operates similarly to the eighth embodiment. Namely, in response to the rising edge of the clock signal /CK, a negative pulse /OUT having the width set by the delay time td of the delay circuit DLY10 is generated.

On the other hand, by disconnecting the fuse F1, the node ND6 is held at the high level, and the output terminal of the inverter INV18 is held at the low level. In response to this, the transfer gate TG1 is held in the OFF state, and the transfer gate TG2 is held in the ON state. In this case, the output terminal of the inverter INV14 and the node ND5 are separated, and the normal operation of the signal change detection circuit is not carried out. Both of the node ND5 and node ND1 are connected to the output terminal of the inverter INV15, and the inverted signal of clock signal CK is supplied.

For this reason, the clock controlled inverting means constituted by the pMOS transistors P3 and P4 and the nMOS transistor N2 acts in the same way as a usual inverter and further inverts the output signal of the inverter INV15 and outputs the same to the node ND2. In this case, the output pulse /OUT of the signal change detection circuit becomes the inverted signal of the input clock signal CK.

In this way, by providing the transfer gates TG1 and TG2 controlled in their ON/OFF states by the fuse F1 and the connection or disconnection thereof, at the time of testing the LSI, for example, the pulse width of the clock signal CK input from the external portion is made variable, the width of the pulse /OUT supplied to the internal circuit of LSI is set in accordance with this, and the operation of the LSI internal circuit with the respectively set pulse widths can be easily verified.

As explained above, according to the signal change detection circuit of the present invention, a detection pulse signal of a stable pulse width can be obtained not depending upon the waveform of the input signal, but mainly by the determination of the pulse width by the delay time of the delay circuit of the internal portion and the pulse can be generated at a high speed.

While the invention has been described with reference to specific embodiments chosen for purposes of illustration, it should be apparent that numerous modifications could be made thereto by those skilled in the art without departing from the basic concept and scope of the invention.

What is claimed is:

1. A signal change detection circuit comprising:

an input signal terminal, a set/reset flip-flop means designating one terminal among a set input terminal and a rest input terminal as a priority input terminal, a delaying means with an input terminal which is coupled with an output of the set/reset flip-flop, and a signal transfer controlling means having a control terminal, holding an input signal in response to a control signal of a first level input to the control terminal, transferring the input signal in response to a control signal of a second level input to the control terminal, and selectively transferring only the input signal having either level of the first level or second level to a signal holding means for holding one of the first level or second level of the output signal of the signal transfer controlling means, said signal change detection circuit being constituted so that the output terminal of the signal change detection circuit is connected to the input of the signal transfer controlling means via the delaying means, the input signal terminal being connected to the priority input terminal of the set/reset flip-flop means and the control terminal of the signal transfer controlling means, the output of the signal transfer controlling means connected to the other input terminal of the set/reset flip-flop means, and said signal change detection circuit generating a pulse signal having a predetermined width in accordance with the change of the input signal from the first level to the second level and suppressing the generation of the pulse signal with respect to a change of the input signal from the second level to the first level.

2. A signal change detection circuit as set forth in claim 1, further including said signal holding means for holding one of the first level or second level of the output signal of the signal transfer controlling means.

3. A signal change detection circuit as set forth in claim 2, wherein the signal holding means has a transistor with a drain which is connected to the output terminal of the signal transferring means, with a source which is connected to a second power supply voltage, and with a gate to which an inverted signal of the output signal of the signal transferring means is applied.

4. A signal change detection circuit as set forth in claim 2, further having means for setting an output signal of the signal holding means at a predetermined level in an initial state.

5. A signal change detection circuit comprising:

an input signal terminal, a set/reset flip-flop means designating one terminal among a set input terminal and a rest input terminal as a priority input terminal, a delaying means with an input terminal which is coupled with an output of the set/reset flip-flop, and a signal transfer controlling means having a control terminal, holding an input signal in response to a control signal of a first level input to the control terminal, transferring the input signal in response to a control signal of a second level input to the control terminal, and transferring the input signal having either level of the first level or second level, and a signal holding means for holding either of the first level or the second level of the output signal of the signal transfer controlling means;

said signal change detection circuit being constituted so that an output terminal of a signal change detection circuit is connected to the input of the signal transfer controlling means via the delaying means.

the input signal terminal being connected to one input terminal of the set/reset flip-flop means and the control terminal of the signal transfer controlling means, and the output terminal of the signal transfer controlling means is connected to the other input terminal of the set/reset flip-flop means; and said signal change detection circuit generating a pulse signal having a predetermined width in accordance with a change of the input signal from the first level to the second level and suppressing the generation of the pulse signal with respect to a change of the input signal from the second level to the first level.

6. A signal change detection circuit as set forth in claim 5, wherein the signal transfer controlling means comprises a pair of transistors constituting a complementary type inversion amplification circuit and a transistor having the control terminal as its input connected in series between a first power supply terminal and a second power supply terminal.

7. A signal change detection circuit as set forth in claim 5, wherein the set/reset flip-flop means is constituted by first and second transistors connected between a first power supply terminal and a second power supply terminal and a middle point of connection thereof as the output terminal, the input signal terminal being connected to the gate electrode of the first or second transistor.

8. A signal change detection circuit as set forth in claim 7, wherein the first and second transistors are insulation gate type field effect transistors of the same conductivity type.

9. A signal change detection circuit as set forth in claim 5, wherein the signal holding means has a transistor with a drain which is connected to the output terminal of the signal transferring means, with a source which is connected to a second power supply voltage, and with a gate to which an inverted signal of the output signal of the signal transferring means is applied.

10. A signal change detection circuit as set forth in claim 5, further having a means for setting an output signal of the signal holding means at a predetermined level in an initial state.

11. A signal change detection circuit, comprising:

an input signal terminal, a set/reset flip-flop means designating one terminal among a set input terminal and a reset input terminal as a priority input terminal, a delaying means with an input terminal which is coupled with an output of the set/reset flip-flop, and a signal transfer controlling means having a control terminal, holding an put signal in response to a control signal of a first level input to the control terminal, transferring the input signal in response to a control signal of a second level input to the control terminal, and selectively transferring only the input signal having either level of the first level or second level, said signal change detection circuit being constituted so that the output terminal of the signal change detection circuit is connected to the input of the signal transfer controlling means via the delaying means, the input signal terminal being connected to the priority input terminal of the set/reset flip-flop means and the control terminal of the signal transfer controlling means, the output of the signal transfer controlling means connected to the other input terminal of the set/reset flip-flop means, and said signal change detection circuit generating a pulse signal having a predetermined width in accordance with the change of the input signal from the first level to the second level and suppressing the generation of the pulse signal with respect to a change of the input signal from the second level to the first level, wherein the set/reset flip-flop means is constituted by first and second transistors connected between a first power supply terminal and a second power supply terminal and a middle point of connection thereof as the output terminal, the input signal terminal being connected to the gate electrode of the first or second transistor.

12. A signal change detection circuit as set forth in claim 11, wherein the first and second transistors are insulation gate type field effect transistors of the same conductivity type.

* * * * *

UNITED STATES PATENT AND TRADEMARK OFFICE
CERTIFICATE OF CORRECTION

PATENT NO. : 6,081,144
DATED : June 27, 2000
INVENTOR(S) : Hideki Usuki et al.

Page 1 of 1

It is certified that error appears in the above-identified patent and that said Letters Patent is hereby corrected as shown below:

Column 14,
Line 57 (claim 11, line 9), delete "put", and insert -- input --.

Signed and Sealed this

Thirtieth Day of October, 2001

Attest:

*Attesting Officer*

NICHOLAS P. GODICI
*Acting Director of the United States Patent and Trademark Office*